United States Patent
Benisty et al.

(10) Patent No.: US 11,838,033 B1
(45) Date of Patent: Dec. 5, 2023

(54) PARTIAL SPEED CHANGES TO IMPROVE IN-ORDER TRANSFER

(71) Applicant: Western Digital Technologies, Inc., San Jose, CA (US)

(72) Inventors: Shay Benisty, Beer Sheva (IL); Ariel Navon, Revava (IL); Alexander Bazarsky, Holon (IL); David Avraham, Even Yehuda (IL)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/949,130

(22) Filed: Sep. 20, 2022

(51) Int. Cl.
| | | |
|---|---|---|
| *H03M 13/11* | (2006.01) | |
| *G06F 13/16* | (2006.01) | |
| *H03M 13/15* | (2006.01) | |
| *H03M 13/01* | (2006.01) | |

(52) U.S. Cl.
CPC ..... *H03M 13/1145* (2013.01); *G06F 13/1689* (2013.01); *H03M 13/015* (2013.01); *H03M 13/1575* (2013.01)

(58) Field of Classification Search
CPC .................................................. H03M 13/1145
See application file for complete search history.

(56) References Cited

U.S. PATENT DOCUMENTS

| | | | |
|---|---|---|---|
| 7,031,348 B1 * | 4/2006 | Gazit ................. | H04N 21/2343 375/365 |
| 8,499,206 B2 | 7/2013 | Cho et al. | |
| 9,905,301 B2 | 2/2018 | Yoo et al. | |
| 10,514,748 B2 | 12/2019 | Tidwell et al. | |
| 10,534,546 B2 | 1/2020 | Benisty et al. | |
| 10,838,807 B2 | 11/2020 | Parry et al. | |
| 10,891,075 B2 | 1/2021 | Chun et al. | |
| 2002/0124227 A1 * | 9/2002 | Nguyen ............ | H03M 13/2957 714/786 |
| 2003/0084398 A1 * | 5/2003 | Nguyen ............ | H03M 13/2771 714/786 |
| 2012/0198175 A1 | 8/2012 | Atkisson | |
| 2018/0173655 A1 | 6/2018 | Achtenberg et al. | |
| 2021/0384919 A1 | 12/2021 | Lee et al. | |

FOREIGN PATENT DOCUMENTS

WO      2022185090 A1    9/2022

OTHER PUBLICATIONS

Yang, S. S., et al., "An FPGA-Based LDPC Decoder With Ultra-Long Codes for Continuous-Variable Quantum Key Distribution", IEEE Access, vol. 9, DOI: 10.1109/ACCESS.2021.3065776, pp. 47687-47697, (Mar. 12, 2021).

* cited by examiner

*Primary Examiner* — Joseph D Torres
(74) *Attorney, Agent, or Firm* — PATTERSON + SHERIDAN, LLP; Steven H. VerSteeg

(57) ABSTRACT

The present disclosure generally relates partial speed changes to improve in-order data transfer. Rather than determining an ECC decoder on a first available decoder basis, the ECC decoder may be based on the ECC decoder level. A memory device will have at least one FMU that has a syndrome weight (SW). The disclosure proposes assigning FMU's based on the SW rate. At the time the command is read, the data storage device determines which level of decoder will be assigned to the FMU. The determination will then be checked according to different system environment parameters to maintain performance or reduce power consumption. The arrangement allows a more flexible system design that can adapt according to the current system status.

12 Claims, 7 Drawing Sheets

| BER | ECC | Processors | Data-path | Host Interface | NAND Toggle Mode | DRAM |
|---|---|---|---|---|---|---|
| 0-0.1% | 400MHz | 1200MHz | 800MHz | 1GHz (15GB/Sec) | 3200 MHz | 4266MT/Sec |
| 0.1-0.5% | 500MHz | 1200MHz | 400MHz | 500MHz (7.3GB/Sec) | 2800 MHz | 3200MT/Sec |
| 0.5-1% | 600MHz | 800MHz | 800MHz | 250MHz (3.2GB/Sec) | 2000 MHz | 2400MT/Sec |
| >1% | 700MHz | 800MHz | 400MHz | 250MHz (3.2GB/Sec) | 1000 MHz | 1200MT/Sec |

FIG. 4

PARTIAL SPEED CHANGES TO IMPROVE IN-ORDER TRANSFER

BACKGROUND OF THE DISCLOSURE

Field of the Disclosure

Embodiments of the present disclosure generally relate to partial speed changes to improve in-order transfer of a memory device.

Description of the Related Art

A storage device comprises different components that may operate in different clock rates. The clock rate is very significant to the overall performance of the system, both in read and write latencies and power consumption. Components are usually synthesized to support the highest possible clock rate, but the clock may be reduced without negative implications. The clock rate of each hardware (HW) element has a direct impact on the performance, power consumption (as well as other metrics) of each component and of the overall system performance.

Clock rates are based on a set table of frequencies that are fixed at the rate defined in the table. Using a set table leads to the clock rates not being able to change based on the different system environments, which will cause performance issues and latency. Furthermore, clock rates are only based on one parameter, such as workload. Determining the clock frequency on workload alone will cause latency in production of the memory device.

A data storage device comprises different decoding engines or decoders that may finish decoding at different times. Decoding finish times impact the overall performance of the system power consumption. Data is usually decoded in the order received. Furthermore, the data is typically decoded using the first available decoding engine available.

The approach causes latency in finish time of the decoders. If an error correction code (ECC) decoder level is not optimal for performance, then the decoder completion time will be impacted. Using a less than optimal ECC decoder level for data will increase the decoding time of the data, which leads to inconsistent finish times of decoding and performance degradation.

Therefore, there is a need in the art for partial speed changes to improve in-order data transfer time.

SUMMARY OF THE DISCLOSURE

The present disclosure generally relates partial speed changes to improve in-order data transfer. Rather than determining an ECC decoder on a first available decoder basis, the ECC decoder may be based on the ECC decoder level. A memory device will have at least one FMU that has a syndrome weight (SW). The disclosure proposes assigning FMU's based on the SW rate. At the time the command is read, the data storage device determines which level of decoder will be assigned to the FMU. The determination will then be checked according to different system environment parameters to maintain performance or reduce power consumption. The arrangement allows a more flexible system design that can adapt according to the current system status.

In one embodiment, a data storage device comprises: a memory device; and a controller coupled to the memory device, wherein the controller is configured to: retrieve first data from the memory device; retrieve second data from the memory device; decode the first data in a first decoder having a first decoding speed; decode the second data in a second decoder having a second decoding speed that is faster than the first decoding speed; and change a clock frequency of either the first decoder or the second decoder to cause the first decoder and the second decoder to complete decoding at substantially the same time.

In another embodiment, a data storage device comprises: a memory device; and a controller coupled to the memory device, wherein the controller is configured to: receive a read request to retrieve first data and second data, wherein the first data is to be delivered to a host device prior to the second data; determine that the first data will take longer to decode than the second data; and adjust decoding speed of the second data such that the first data and the second data finish decoding substantially simultaneously.

In another embodiment, a data storage device comprises: memory means; and a controller coupled to the memory means, wherein the controller is configured to: adjust a clock frequency for at least one decoding unit while leaving at least one other decoding unit at an unchanged clock frequency, wherein the adjusting comprises reducing the clock frequency, wherein the at least one decoding unit utilizes less power compared to the at least one other decoding unit; and deliver data decoded in the at least one other decoding unit to a host device prior to data decoded in the at least one decoding unit.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 4 is a schematic illustration of an operations table according to certain embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates partial speed changes to improve in-order data transfer. Rather than determining an ECC decoder on a first available decoder basis, the ECC decoder may be based on the ECC decoder level. A memory device will have at least one FMU that has a syndrome weight (SW). The disclosure proposes assigning FMU's based on the SW rate. At the time the command is read, the data storage device determines which level of decoder will be assigned to the FMU. The determination will then be checked according to different system environment parameters to maintain performance or reduce power consumption. The arrangement allows a more flexible system design that can adapt according to the current system status.

The device disclosed herein results in an ECC decoder power level determined by the FMU. The SW rate of the first FMU will determine the ECC decoder level for the remaining. If the SW rate is high for the first FMU. The remaining FMU's will have a lower ECC decoder level. On the other hand, if the SW rate is low for the first FMU. The remaining FMU's will have a higher ECC decoder level.

Figure 1:
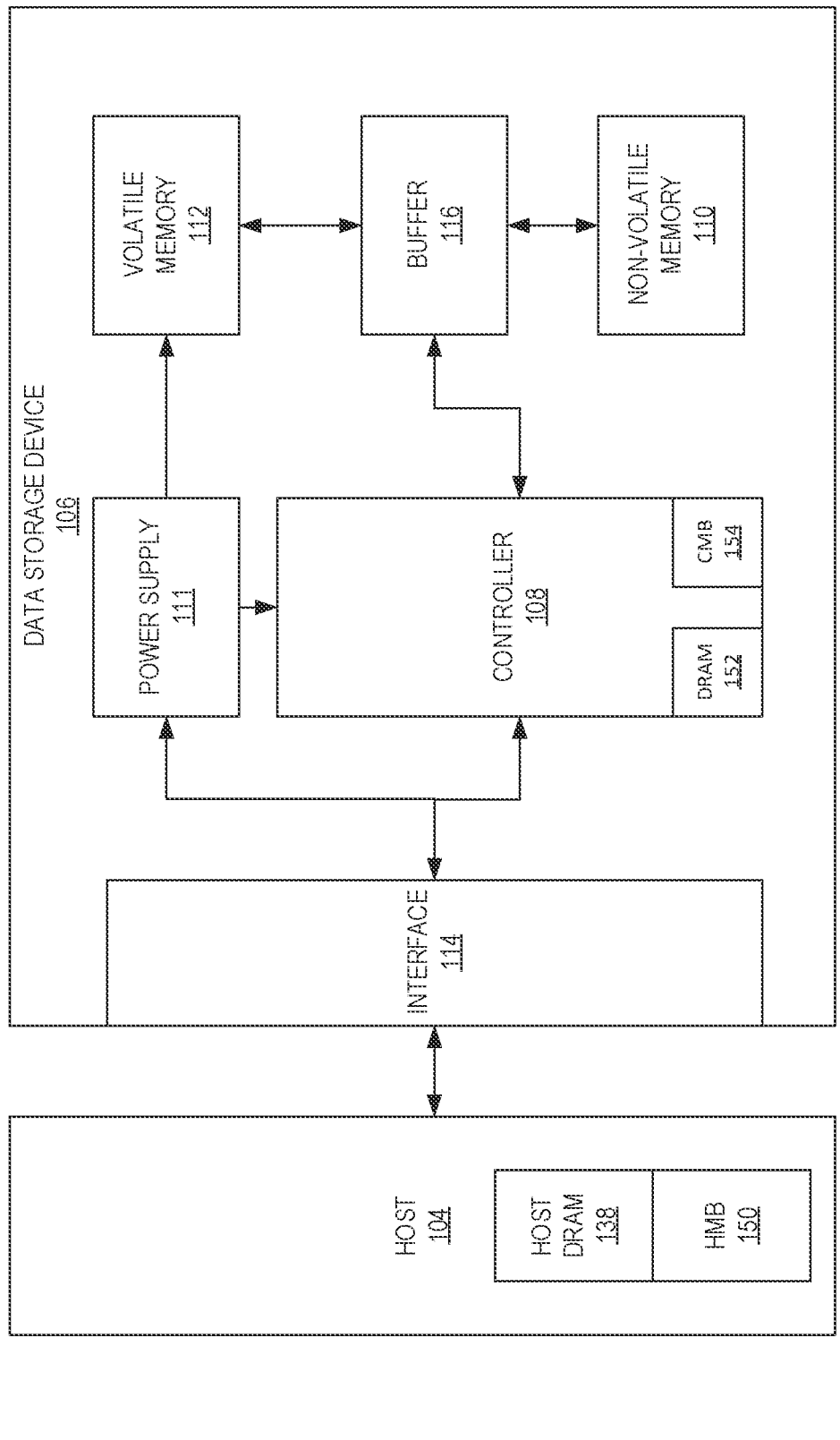
FIG. 1 is a schematic block diagram illustrating a storage system in which a data storage device may function as a storage device for a host device, according to certain embodiments.

FIG. 1 is a schematic block diagram illustrating a storage system 100 in which a host device 104 is in communication with a data storage device 106, according to certain embodiments. For instance, the host device 104 may utilize a non-volatile memory (NVM) 110 included in data storage device 106 to store and retrieve data. The host device 104 comprises a host DRAM 138 and, optionally, a host memory buffer (HMB) 150. In some examples, the storage system 100 may include a plurality of storage devices, such as the data storage device 106, which may operate as a storage array. For instance, the storage system 100 may include a plurality of data storage devices 106 configured as a redundant array of inexpensive/independent disks (RAID) that collectively function as a mass storage device for the host device 104.

The host device 104 may store and/or retrieve data to and/or from one or more storage devices, such as the data storage device 106. As illustrated in FIG. 1, the host device 104 may communicate with the data storage device 106 via an interface 114. The host device 104 may comprise any of a wide range of devices, including computer servers, network-attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, or other devices capable of sending or receiving data from a data storage device.

The data storage device 106 includes a controller 108, NVM 110, a power supply 111, volatile memory 112, the interface 114, and a write buffer 116. In some examples, the data storage device 106 may include additional components not shown in FIG. 1 for the sake of clarity. The controller 108 may include volatile memory such as DRAM 152 as well as a controller memory buffer (CMB) 154 dedicated for host device 104 usage. For example, the data storage device 106 may include a printed circuit board (PCB) to which components of the data storage device 106 are mechanically attached and which includes electrically conductive traces that electrically interconnect components of the data storage device 106 or the like. In some examples, the physical dimensions and connector configurations of the data storage device 106 may conform to one or more standard form factors. Some example standard form factors include, but are not limited to, 3.5" data storage device (e.g., an HDD or SSD), 2.5" data storage device, 1.8" data storage device, peripheral component interconnect (PCI), PCI-extended (PCI-X), PCI Express (PCIe) (e.g., PCIe x1, x4, x8, x16, PCIe Mini Card, MiniPCI, etc.). In some examples, the data storage device 106 may be directly coupled (e.g., directly soldered or plugged into a connector) to a motherboard of the host device 104.

Interface 114 may include one or both of a data bus for exchanging data with the host device 104 and a control bus for exchanging commands with the host device 104. Interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), Open Channel SSD (OCSSD), or the like. Interface 114 (e.g., the data bus, the control bus, or both) is electrically connected to the controller 108, providing an electrical connection between the host device 104 and the controller 108, allowing data to be exchanged between the host device 104 and the controller 108. In some examples, the electrical connection of interface 114 may also permit the data storage device 106 to receive power from the host device 104. For example, as illustrated in FIG. 1, the power supply 111 may receive power from the host device 104 via interface 114.

The NVM 110 may include a plurality of memory devices or memory units. NVM 110 may be configured to store and/or retrieve data. For instance, a memory unit of NVM 110 may receive data and a message from controller 108 that instructs the memory unit to store the data. Similarly, the memory unit may receive a message from controller 108 that instructs the memory unit to retrieve data. In some examples, each of the memory units may be referred to as a die. In some examples, the NVM 110 may include a plurality of dies (i.e., a plurality of memory units). In some examples, each memory unit may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, each memory unit may include any type of non-volatile memory devices, such as flash memory devices, phase-change memory (PCM) devices, resistive random-access memory (ReRAM) devices, magneto-resistive random-access memory (MRAM) devices, ferroelectric random-access memory (F-RAM), holographic memory devices, and any other type of non-volatile memory devices.

The NVM 110 may comprise a plurality of flash memory devices or memory units. NVM Flash memory devices may include NAND or NOR-based flash memory devices and may store data based on a charge contained in a floating gate of a transistor for each flash memory cell. In NVM flash memory devices, the flash memory device may be divided into a plurality of dies, where each die of the plurality of dies includes a plurality of physical or logical blocks, which may be further divided into a plurality of pages. Each block of the plurality of blocks within a particular memory device may include a plurality of NVM cells. Rows of NVM cells may be electrically connected using a word line to define a page of a plurality of pages. Respective cells in each of the plurality of pages may be electrically connected to respective bit lines. Furthermore, NVM flash memory devices may be 2D or 3D devices and may be single level cell (SLC), multi-level cell (MLC), triple level cell (TLC), or quad level cell (QLC). The controller 108 may write data to and read data from NVM flash memory devices at the page level and erase data from NVM flash memory devices at the block level.

The power supply 111 may provide power to one or more components of the data storage device 106. When operating in a standard mode, the power supply 111 may provide power to one or more components using power provided by an external device, such as the host device 104. For instance, the power supply 111 may provide power to the one or more components using power received from the host device 104 via interface 114. In some examples, the power supply 111 may include one or more power storage components configured to provide power to the one or more components when operating in a shutdown mode, such as where power ceases to be received from the external device. In this way, the power supply 111 may function as an onboard backup power source. Some examples of the one or more power storage components include, but are not limited to, capacitors, super-capacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

The volatile memory 112 may be used by controller 108 to store information. Volatile memory 112 may include one or more volatile memory devices. In some examples, controller 108 may use volatile memory 112 as a cache. For instance, controller 108 may store cached information in volatile memory 112 until the cached information is written to the NVM 110. As illustrated in FIG. 1, volatile memory 112 may consume power received from the power supply 111. Examples of volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)).

Controller 108 may manage one or more operations of the data storage device 106. For instance, controller 108 may manage the reading of data from and/or the writing of data to the NVM 110. In some embodiments, when the data storage device 106 receives a write command from the host device 104, the controller 108 may initiate a data storage command to store data to the NVM 110 and monitor the progress of the data storage command. Controller 108 may determine at least one operational characteristic of the storage system 100 and store at least one operational characteristic in the NVM 110. In some embodiments, when the data storage device 106 receives a write command from the host device 104, the controller 108 temporarily stores the data associated with the write command in the internal memory or write buffer 116 before sending the data to the NVM 110.

Figure 2:
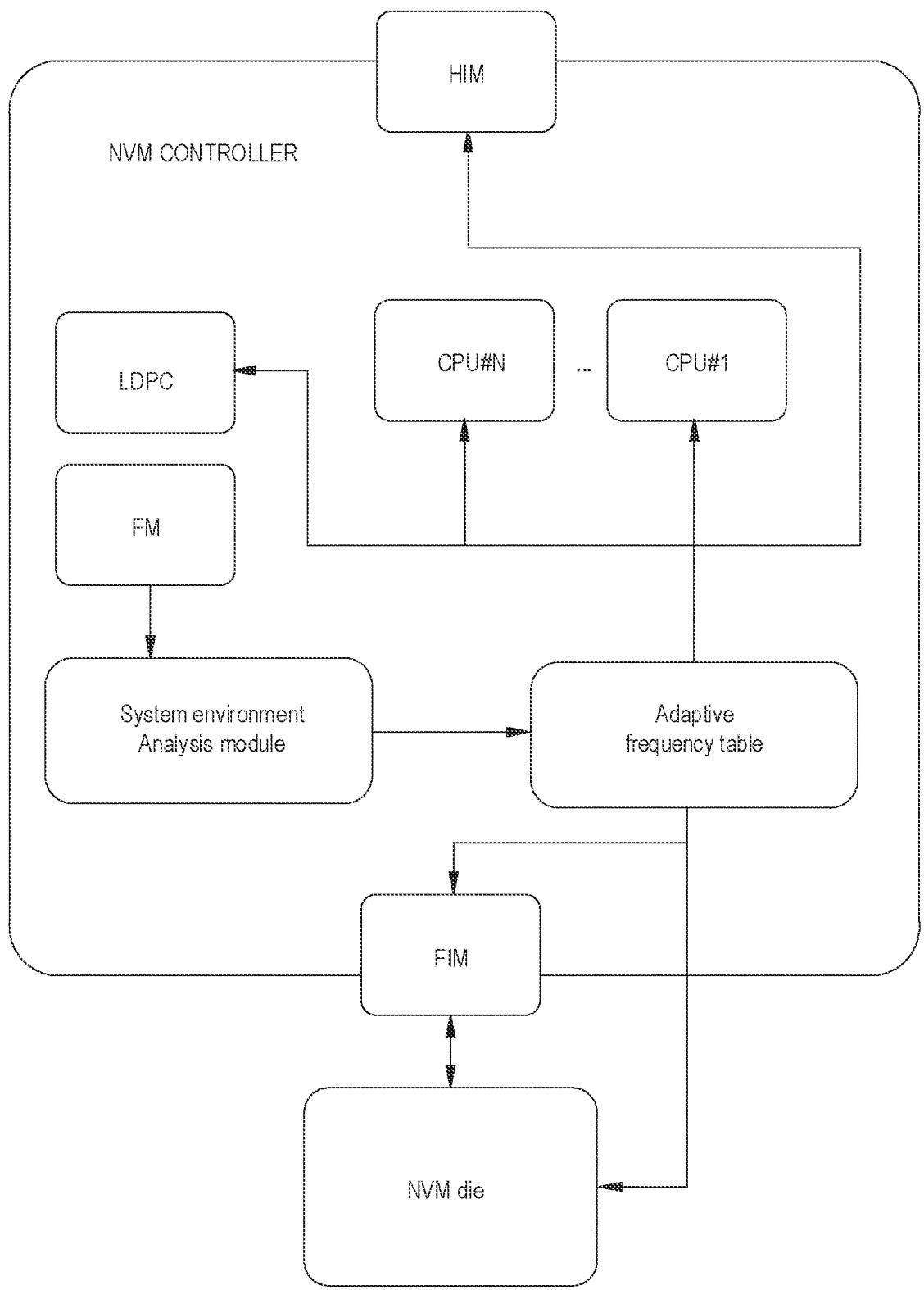
FIG. 2 is a schematic block diagram illustrating a storage system using a system environment analysis module (SEAM) and adaptive frequency table, according to one embodiment.

FIG. 2 is a block diagram illustrating a storage system using a system environment analysis module (SEAM) and Adaptive Frequency Table (AFT), according to one embodiment. The SEAM receives its inputs from the frequency monitor (FM) layer with the above features. Then, the adaptive frequency table receives indication of mode change and supplies frequencies to all the system components. Components are usually synthesized to support the highest possible clock rate, but the clock may be reduced without negative implications.

The module is equipped with both a HIM and a FIM. The HIM being in direct communication with the host and the LDPC. The LDPC is in communication with at least the first central processing unit (CPU) and any other plurality of CPU's in any given module. The FM is coupled to the SEAM. The FIM, where the inputs are received for the NVM controller, is in communication with the AFT. The AFT in direct communication with the SEAM. The AFT is able to change the frequency based on the conditions that the SEAM tracks. The AFT is also in communication with the NVM die, which is in communication with the FIM.

Figure 3:
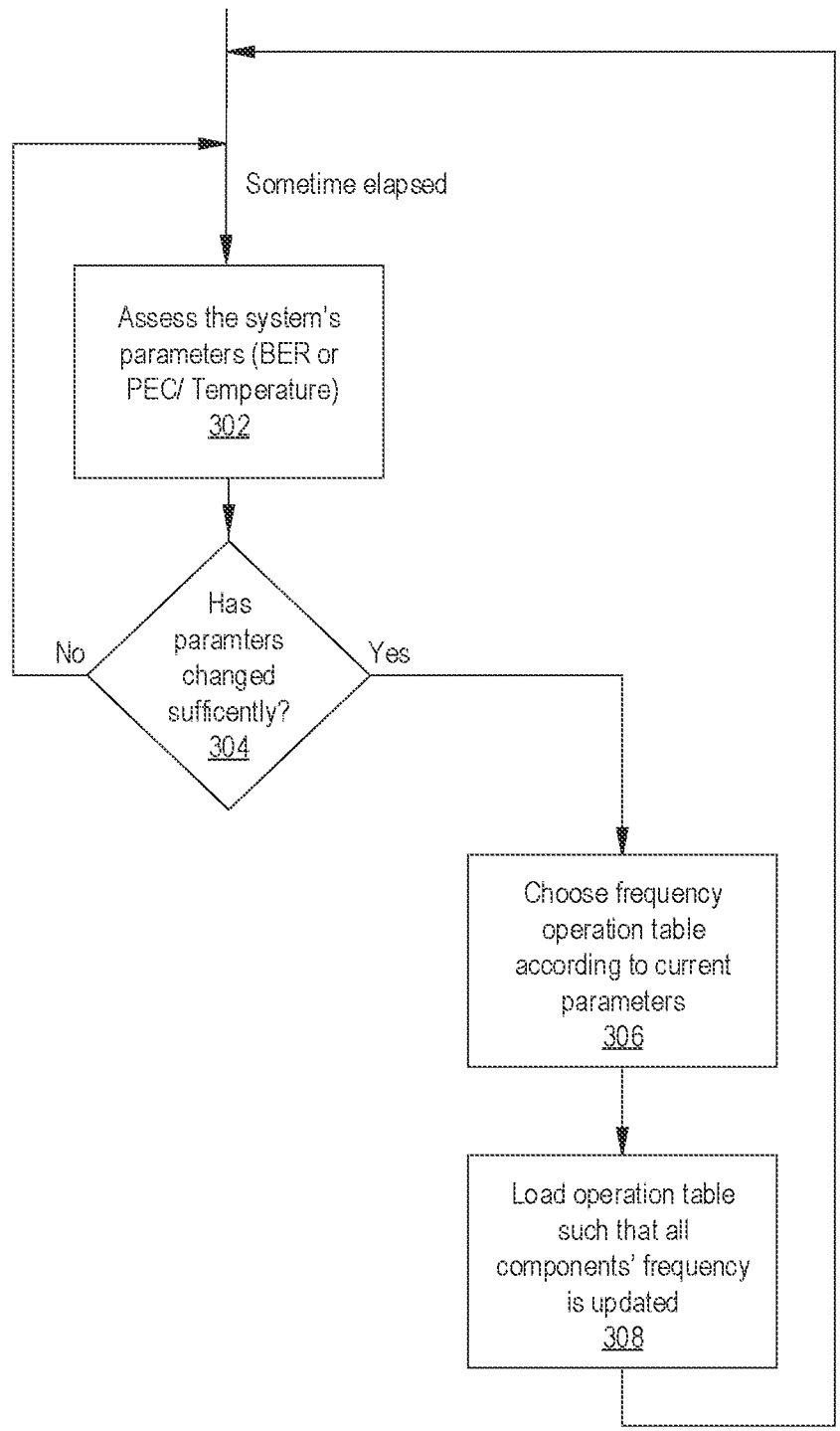
FIG. 3 is a flowchart illustrating adaptive and dynamic tuning according to one embodiment.

FIG. 3 is a flowchart illustrating adaptive and dynamic tuning according to one embodiment. The SEAM's operation may either be triggered with some external signal or use a polling mode triggering after some time has elapsed.

In operation 302, the module assess the system's parameters. The module may check, for example: average/maximum program/erase (P/E) cycles, average/maximum bit error rate (BER), device temperature, and block health (i.e., number of reserved replacement blocks, past relocation rate).

In operation 304, the module determines whether the parameters have changed sufficiently. The module will then move to operation 306 or back to operation 302 after some time has elapsed again, depending upon the results of the determination at 304. If the parameters have not changed sufficiently, then the operation goes back to 302 whereas if the parameters have changed sufficiently, then the process continues to 306.

In operation 306, the module chooses a frequency from the operation table according to the current parameters. The parameters will determine the most efficient frequency to carry out the requested command.

In operation 308, the module will load the operation table such that all the components frequencies are updated. The updated list will allow for the components to operate more efficiently based on that current environment. Thereafter, the data storage device waits and then reassesses the system parameters at 302.

FIG. 4 is a schematic illustration of an operations table according to certain embodiments. The table displays different clock rates for different system elements as function of BER. The different clock rates are adapted for each BER range. The BER may either be conveyed through P/E count and temperature range tables (reflecting BER elevation that is attributed to the condition change) or calculated directly by firmware (FW) or error correcting code (ECC).

When the BER is elevated, the FIM is no longer the system bottleneck, and the FIM clock rate can be reduced, for example. The ECC, however, becomes the bottleneck, (specifically the more powerful full power (FP) gear) and the ECC clock may be raised as reflected in FIG. 4.

When the BER is low the BER the ECC can work less. As the BER increases the BER the ECC needs to work harder. The processers have a different impact than the ECC. When the ECC is low, the processors are at a higher frequency, but when the ECC is high the processors are at a lower frequency.

The host interface module (HIM), NAND Toggle Mode, and DRAM all decrease as the BER increases. Each of the HIM, NAND Toggle Mode, and DRAM are inversely proportional to the ECC in terms of frequency change relative to BER.

Figure 5:
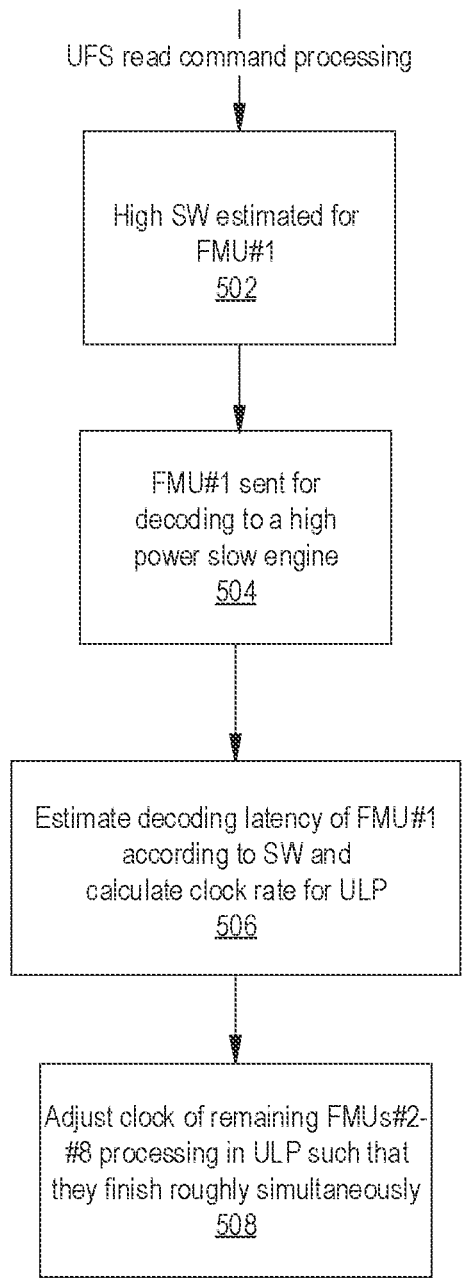
FIG. 5 is a flowchart illustrating universal flash storage (UFS) according to one embodiment.

FIG. 5 is a flowchart illustrating a universal flash storage impacts according to one embodiment. The required order of the output data may determine some clock modifications. In UFS and eMMC interfaces (and other serial interfaces) the decoded data is sent out to the host in order. In a system that contains several decoding engines, if one of the data flash management units (FMUs) was detected to show high BER, the decoding latency will be increased.

The other data FMUs can be decoded separately using the other system engines, but then data storage device will wait for the slower FMU before releasing to the host. The system will be stalled due to lack of storage buffers and cannot proceed to other data.

In this embodiment, the other system engines may be slowed down using assessment of the longer decoding latency to ideally finish decoding at the same time. Having decoding of all FMU's finish at close to the same time as possible will lead peak performance of the system. The further from a simultaneous finish between the FMU #1 and remaining FMU's will cause degradation in system operations and greater latency. Latency is only needed when you need decoding of a FMU to finish at a desired time.

In operation 502, the system responds to processing a UFS read command by estimating a high syndrome weight (SW) for FMU #1. The processing of the read command impacts the entire operation, because the determination of the SW will determine the optimal SW for the remaining FMU's.

In operation 504, the FMU #1 is sent for decoding to a high power slower engine. Since the FMU #1 was sent to the high power, slow engine it can be assumed that BER rate is high leading to a high ECC rate. The high power slow engine is the best decoding for FMU #1 because the engines that are lower will take longer to complete.

In operation 506, the system estimates the decoding latency of the FMU #1 according to SW and calculates clock rate for ultra-low power (ULP). The FMU #1 will have an estimated time for when the FMU #1 will be finished decoding. The estimated time determines the clock rate for the following FMU's. FMU #1 determines the completion time of the remaining FMU's.

In operation 508, the system adjusts the clock of the remaining FMU's #2-#8 processing in ULP such that the FMUs finish roughly simultaneously. The remaining FMU's are decoded in lower power engine than the FMU #1 because the high power engine will complete the decoding for the remaining FMU's faster than the time to complete the FMU #1 causing latency issues. Ideally the frequencies of the remaining FMU's will be increased to account for the lower BER and ECC rates causing the decoding to finish as close to simultaneously with the FMU #1 as possible.

Figure 6:
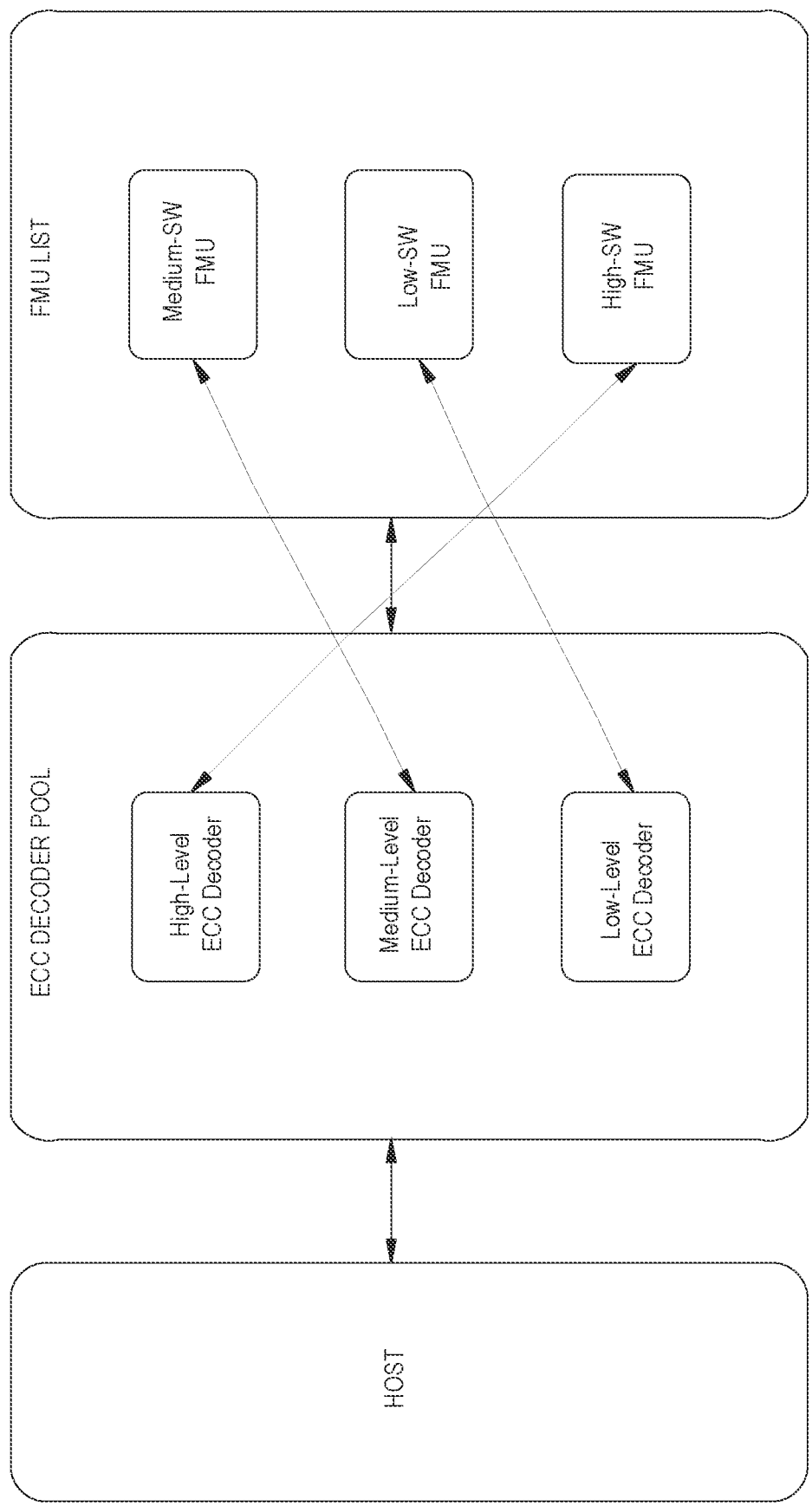
FIG. 6 is a schematic block diagram illustrating an ECC decoder pool according to one embodiment.

FIG. 6 is a schematic block diagram illustrating an ECC decoder pool according to one embodiment. It is to be understood that while three decoders and three FMUs have been shown, more or less decoders and FMUs may be present. The ECC decoder pool receives commands from the controller to decode the data from FMUs in an FMU list. The FMU's in the list will then be decoded based on SW rate.

The SW rate for the FMUs, in most cases, will be different. The FMU with the highest SW rate will be considered as the High-SW FMU. The FMU with the next highest SW rate will be considered as the Medium-SW FMU. The arrangement will continue for any amount of FMUs that are in the FMU list. The last FMU will be the FMU with the lowest SW rate, which will be considered as the Low-SW FMU. Alternatively the FMUs may begin processing with ULP. The method will continue in ULP until the ULP does not converge. If the ULP does not converge then the FP engine activates for the FMUs.

The ECC decoder pool has different decoding engine levels. The highest ECC decoder will be considered High-Level ECC decoder. The next decoder with the highest level will be considered Medium-Level ECC decoder. The Medium-Level ECC decoder will be a lower level than the High-Level ECC decoder. The lowest level decoder will be considered the Low-Level ECC decoder. The Low-Level ECC decoder will have a lower level than both the High ECC decoder and the Medium ECC decoder.

Rather than assigning a FMU an ECC decoder on the first available decoder, the ECC decoder assigning may be based on the ECC decoder level that is optimal for the data of the FMU decoding completion time. The controller of the data storage device will determine the SW rate of the first FMU. For example of the three FMU's, the first FMU will be considered the High-SW FMU. The High-SW FMU will then immediately begin decoding through the High-Level ECC decoder.

Data from the next FMU will then be read and a determination of the SW rate will occur. For the continued example, the next FMU will be determined as the Medium-SW FMU. The data from the Medium-SW FMU will immediately begin decoding through the Medium-Level ECC decoder so that the data from the Medium-SW FMU will finish decoding at as close to simultaneously as possible with the High-SW FMU.

The example continues as the last FMU will then be determined as Low-SW FMU. Data from the Low-SW FMU will immediately being decoding by the Low-Level ECC decoder so that the data from the Low-SW FMU will finish decoding at as close to simultaneously as possible with both the High-SW FMU and the Medium-SW FMU.

The SW rates for FMUs of any set of FMUs will determine the decoding finish time. The ideal completion time for all data from all FMUs in a given FMU list will be the same or as close to simultaneously as possible. The time of decoding completion is determined by the clock rate for the first FMU. The remaining FMUs will then have clock rates changed when the device determines the SW rate for each of the remaining FMUs. A same time finish or as close to simultaneous finish for all FMUs is possible when the data storage device determines the ECC decoder level for each FMU on the list based on the SW rate and clock rates.

Figure 7:
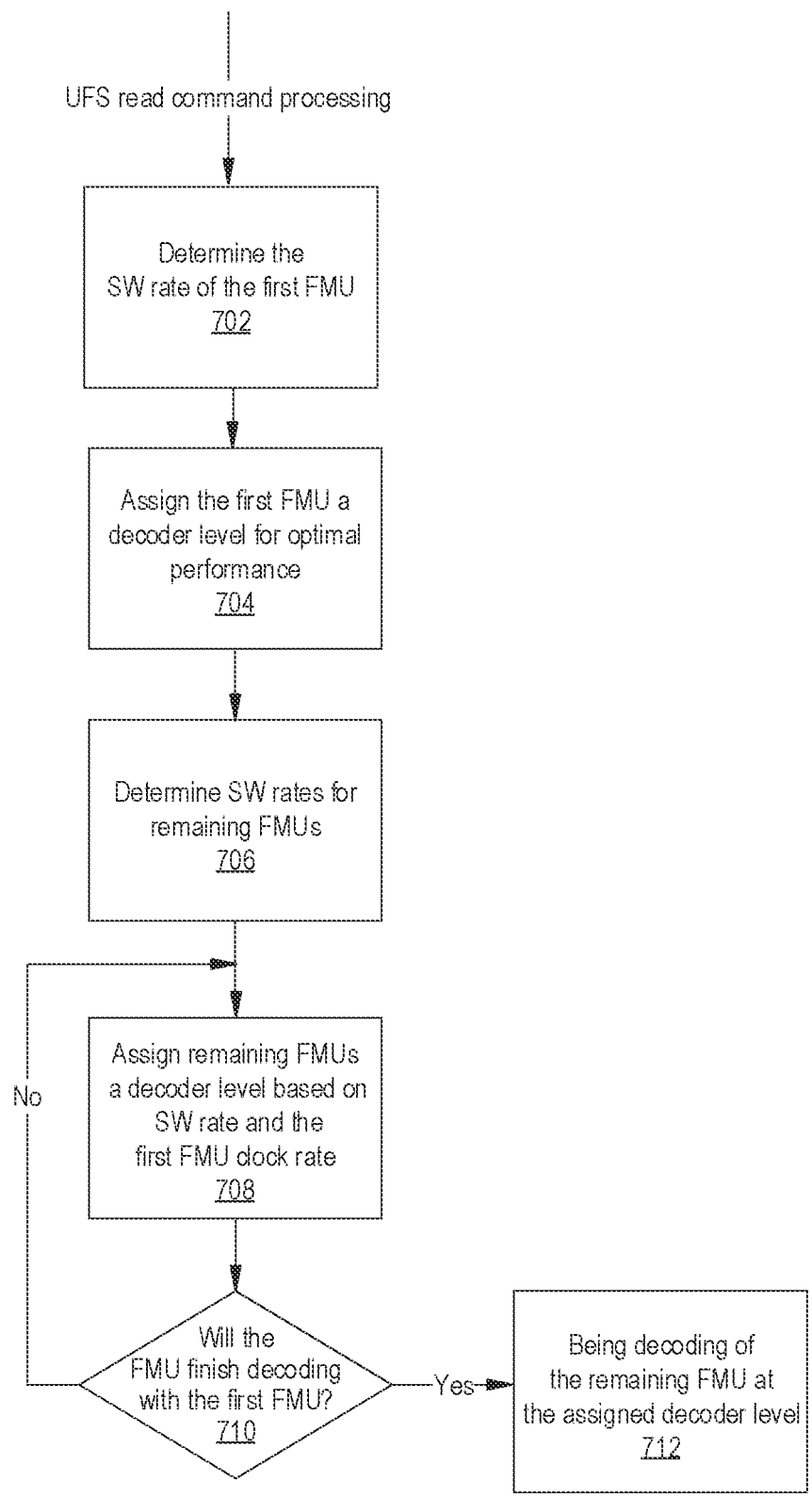
FIG. 7 is a flowchart illustrating universal flash storage (UFS) according to one embodiment.

FIG. 7 is a flowchart illustrating universal flash storage (UFS) according to one embodiment. UFS read command processing begin and a determination is made at 702 regarding the SW of the first FMU. The first FMU is then assigned a decoder level for optimal performance at 704. The SW for the remaining FMUs is then determined at 706 and the remaining FMUs are assigned a decoder level based on the SW and first FMU clock rate at 708. A determination is then made at 710 regarding whether the data for FMU will finish decoding at the same time as the first FMU. If the decoding will finish at the same time, or substantially the same time (i.e., +/−5%) then the decoding begins at 712. If the decoding will not finish at the same time, then the decoder assignment will be reconsidered.

In one embodiment, a data storage device comprises: a memory device; and a controller coupled to the memory device, wherein the controller is configured to: retrieve first data from the memory device; retrieve second data from the memory device; decode the first data in a first decoder having a first decoding speed; decode the second data in a second decoder having a second decoding speed that is faster than the first decoding speed; and change a clock frequency of either the first decoder or the second decoder to cause the first decoder and the second decoder to complete decoding at substantially the same time. The first data has a higher syndrome weight than the second data. The controller comprises an error correction module, volatile memory, a host interface module (HIM), a flash interface module (FIM), at least one processor, and a frequency monitor (FM). Changing the clock frequency comprises decreasing the clock frequency of the second decoder. The controller is further configured to estimate a decoding latency of the first decoder. The latency is based upon syndrome weight. The controller is configured to calculate a clock rate for the second decoder. The first data has a higher bit error rate (BER) compared to the second data. The data storage device operates on universal flash storage (UFS) protocol. The controller is configured to deliver the first data and the second data in an order requested by a host device. The controller is configured to detect a bit error rate (BER) for the first data and a BER for the second data. The first data and the second data are both associated with a common read command.

In another embodiment, a data storage device comprises: a memory device; and a controller coupled to the memory device, wherein the controller is configured to: receive a read request to retrieve first data and second data, wherein the first data is to be delivered to a host device prior to the second data; determine that the first data will take longer to decode than the second data; and adjust decoding speed of the second data such that the first data and the second data finish decoding substantially simultaneously. The controller comprises an error correction module, a host interface module (HIM), flash interface module (FIM), and volatile memory. Decoding speed of the first data is due to a higher bit error rate (BER) than the second data. Adjusting the decoding speed comprises reducing a clock frequency for a decoder that decodes the second data. Increasing a clock frequency for a decoder that decodes the first data.

In another embodiment, a data storage device comprises: memory means; and a controller coupled to the memory means, wherein the controller is configured to: adjust a clock frequency for at least one decoding unit while leaving at least one other decoding unit at an unchanged clock frequency, wherein the adjusting comprises reducing the clock frequency, wherein the at least one decoding unit utilizes less power compared to the at least one other decoding unit; and deliver data decoded in the at least one other decoding unit to a host device prior to data decoded in the at least one decoding unit. The controller comprises a system environment analysis module. The controller includes an adaptive frequency table.

As discussed herein, determining the ECC decoder level based on the first FMU, allows for increased performance. The determination allows the system to finish decoding all FMU's at the same time as close to simultaneously as possible.

While the foregoing is directed to embodiments of the present disclosure, other and further embodiments of the disclosure may be devised without departing from the basic scope thereof, and the scope thereof is determined by the claims that follow.

What is claimed is:

1. A data storage device, comprising:
a memory device; and
a controller coupled to the memory device, wherein the controller is configured to:
retrieve first data from the memory device;
retrieve second data from the memory device;
decode the first data in a first decoder having a first decoding speed;
decode the second data in a second decoder having a second decoding speed that is faster than the first decoding speed; and
change a clock frequency of either the first decoder or the second decoder to cause the first decoder and the second decoder to complete decoding at substantially the same time.

2. The data storage device of claim 1, wherein the first data has a higher syndrome weight than the second data.

3. The data storage device of claim 1, wherein the controller comprises an error correction module, volatile memory, a host interface module (HIM), a flash interface module (FIM), at least one processor, and a frequency monitor (FM).

4. The data storage device of claim 1, wherein changing the clock frequency comprises decreasing the clock frequency of the second decoder.

5. The data storage device of claim 1, wherein the controller is further configured to estimate a decoding latency of the first decoder.

6. The data storage device of claim 5, wherein the latency is based upon syndrome weight.

7. The data storage device of claim 6, wherein the controller is configured to calculate a clock rate for the second decoder.

8. The data storage device of claim 1, wherein the first data has a higher bit error rate (BER) compared to the second data.

9. The data storage device of claim 1, wherein the data storage device operates on universal flash storage (UFS) protocol.

10. The data storage device of claim 1, wherein the controller is configured to deliver the first data and the second data in an order requested by a host device.

11. The data storage device of claim 1, wherein the controller is configured to detect a bit error rate (BER) for the first data and a BER for the second data.

12. The data storage device of claim 1, wherein the first data and the second data are both associated with a common read command.

\* \* \* \* \*